United States Patent
Kikuchi

(10) Patent No.: US 6,922,269 B2
(45) Date of Patent: Jul. 26, 2005

(54) LIGHT SCANNING UNIT

(75) Inventor: Susumu Kikuchi, Yokohama (JP)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/798,861

(22) Filed: Mar. 12, 2004

(65) Prior Publication Data

US 2004/0196519 A1 Oct. 7, 2004

(30) Foreign Application Priority Data

Apr. 3, 2003 (JP) ......................................... 2003-100325

(51) Int. Cl.$^7$ ............................................. G02B 26/08
(52) U.S. Cl. ....................................... 359/204; 362/237
(58) Field of Search .......................... 359/204; 362/227, 362/230, 231, 237, 240, 249

(56) References Cited

U.S. PATENT DOCUMENTS 6,523,979 B1 * 2/2003 Kawata et al. ............... 362/294

FOREIGN PATENT DOCUMENTS

WO    WO 2004/008023 A1 *  1/2004  ............. F21V/8/00

* cited by examiner

Primary Examiner—Euncha P. Cherry
(74) Attorney, Agent, or Firm—Roylance, Abrams, Berdo & Goodman, L.L.P.

(57) ABSTRACT

A light scanning unit that does not deteriorate print quality and has a simple structure and a low-priced multi-beam shape. The light scanning unit includes a composite light source in which a plurality of light sources for emitting coherent light having different wavelengths are arranged adjacent to one another and an optical axis of each light source is arranged almost parallel to each other and which emits light at a divergeing angle centering on each optical axis, and an optical system comprising a collimator lens arranged on an approximately central axis of an optical axis of each light source comprising the composite light source and collimates the light beam emitted from the composite light source, a cylinder lens for condensing the light beam emitted from the collimator lens, and a polygonal rotating mirror for scanning the light beam condensed by the cylinder lens in a main scanning direction on an exposed surface of an exposed object, and each light source is arranged adjacent to each other on a substrate having a gaseous layer between excitation light-emitting portions of each of the light sources.

5 Claims, 3 Drawing Sheets

LIGHT SCANNING UNIT

This application claims priority to Japanese Patent Application No. 2003-100325, filed on Apr. 3, 2003, in the Japanese Intellectual Property Office, the disclosure of which is incorporated herein by reference in its entirety.

BACKGROUND OF THE INVENTION

1. Field of the Invention

The present invention relates to a light scanning unit. More particularly, the present invention relates to a light scanning unit suitable for an exposure device for an electrophotographic apparatus, such as a color printer having a plurality of exposed objects.

2. Description of the Related Art

An electrophotographic exposure device can be categorized into a devices that use a laser diode and devices that use a light emitting diode (LED). Devices that use an LED usually perform an exposure process by mapping one LED on 1 dot of a pixel of an image to be recorded for an exposed object. In general, devices using the LED use a light source called an LED head in which a plurality of LEDs are arranged.

The light source is configured to arrange an LED chip in which a plurality of LEDs are formed on a substrate and to form a plurality of LED arrays. Japanese Patent Publication No. Hei 10-035011 (published on Feb. 10, 1998) entitled "Light Emitting Diode Array and Fabrication thereof", which is incorporated herein by reference discloses this type of configuration. The disclosed apparatus condenses light onto an image-formed surface by arranging an optical system between an LED and an exposed surface of an exposed object.

In addition, devices using a laser diode scan a laser beam in a main scanning direction on an exposed surface of an exposed object using a light scanning unit.

Devices using a laser diode use an F-θ lens to maintain the same scanning speed and beam shape on an exposed surface. Japanese Patent Publication No. Hei 09-096769 (published on Apr. 8, 1997) entitled "Method and Device for adjusting Optical Axis of Optical Scanner and Optical Scanner", which is incorporated herein by reference discloses this type of configuration.

In the disclosed apparatus, a laser diode emits a laser beam comprising diffused light, and the laser beam is collimated by a collimator lens. The shape of the collimated laser beam is restricted by a slit, and the laser beam is condensed by a cylinder lens in a subscanning direction on a reflective surface of a polygonal rotating mirror which is a light scanning unit. Subsequently, light scanned in a main scanning direction on the polygonal rotating mirror is condensed by an F-θ lens (or lens group) on the exposed surface of an exposed object and is scanned at a uniform speed.

An electrophotographic exposure device using the LED can be reduced in size. However, the following problems must be resolved in order to reduce the size of the device using the LED. First, a plurality of LED chips need to be precisely arranged on a substrate. Second, the circuit of conventional devices is too complex. Third, due to the characteristics of an optical system, the distance from each LED chip to an exposed surface of an exposed object should be precise. Fourth, the quantity and degree of nonuniformity of light between LED chips needs to be corrected.

In addition, in order to scan a laser diode light source using a polygonal rotating mirror onto an exposed surface, the amount of light projected onto the exposed surface is small, the circuit is simple in structure, the depth of focus is deep. Thus, distance precision with respect to an exposed surface is comparatively low.

Recently, electrophotographic color printers have rapidly been developed. The electrophotographic color printer forms an image four times, compared to a conventional black and white printer, so as to condense an image having four colors, such as cyan, magenta, yellow, and black, into one image.

An electrophotographic color printer can be categorized into two types. Single pass electrophotographic color printers and multi-pass electrophotographic color printers. Single pass electrophotographic color printers mount one exposure device in one drum, perform a development process using a four-color developer, superimpose an image on an intermediate transfer body, and transfer the superimposed image onto a sheet of paper.

Multi-pass electrophotographic color printers mount four developers and four exposure devices, and four photosensitive bodies which is mechanically like having four conventional black and white printers superimposed on one another.

In the single pass electrophotographic color printer, an output speed is reduced to ¼ the normal speed, to superimpose an image four times. The single pass electrophotographic color printer has a low speed, and a complex mechanism for moving a developer. In addition, the single pass electrophotographic color printer can configure a photosensitive drum and an exposure device as a single body.

The printing speed of the multi-pass electrophotographic color printer is fast. However, the multi-pass electrophotographic color printer requires four exposure devices and four photosensitive bodies. Thus, the structure becomes complex.

However, a composite light source, which forms a laser diode emits a plurality of light beams having different wavelengths on the same substrate, and is widely uses in a variety of devices. In particular, in an optical pickup, a composite light source having a plurality of laser diodes for emitting light beams having different wavelengths is used as a light source, and reading and recording of data is performed on different media in different optical systems.

Accordingly, as shown in FIGS. 1 and 2, a plurality of laser diode chips 60 and 62 are formed on a substrate 50 integrated into the semiconductor process to reduce manufacturing costs. Here, FIG. 1 is a front view of a composite light source, and FIG. 2 is a side view of FIG. 1, and reference numerals 60A and 60B are excitation light-emitting portions.

In the optical pickup using the composite light source, only one recording medium can be mounted. Thus, after the type of recording medium is recognized, a laser diode for emitting a light beam having a wavelength used to reproduce data recorded on the recording medium is consecutively emitted, and the lights of a laser diode for emitting a light beam having a wavelength that is not used to reproduce data recorded on the recording medium are extinguished.

Meanwhile, when the above-described composite light source is used in an optical printer, information on different images needs to be simultaneously recorded on a plurality of exposed objects (photosensitive drums). Thus, laser diodes for emitting a plurality of light beams having different wavelengths need to be simultaneously driven to emit light.

However, when two adjacent laser diodes formed on the same substrate, as shown in FIGS. 1 and 2, are simultaneously driven, due to the effect of cross-talk of the adjacent laser diodes, a light-emitting characteristic deteriorates due to a variations a material for a light-emitting portion caused by heating or a variation in resistance value of a circuit such as an electrode.

Accordingly, when a composite light source having a plurality of laser diodes is used as a light source of a printer, if the plurality of laser diodes are simultaneously driven and emit light, printing quality deteriorates.

SUMMARY OF THE INVENTION

The present invention provides a light scanning unit using a composite light source having a plurality of laser diodes emitting light beams having different wavelengths for a printer and having a simple structure and a low-priced multi-beam shape without deterioration of printing quality even when the plurality of laser diodes are simultaneously driven.

According to an aspect of the present invention, a light scanning unit is provided. The light scanning unit comprises a composite light source in which a plurality of light sources for emitting coherent light having different wavelengths are arranged adjacent to one another and an optical axis of each light source is arranged almost parallel and which emits light at a divergeing angle centering on each optical axis. The light scanning unit also comprises an optical system comprising a collimator lens arranged on an approximately central axis of an optical axis of each light source comprising the composite light source and collimates the light beam emitted from the composite light source, a cylindrical lens for condensing the light beam emitted from the collimator lens, and a polygonal rotating mirror for scanning the light beam condensed by the cylinder lens in a main scanning direction on an exposed surface of an exposed object, and each light source comprising the composite light source is arranged adjacent to each other on a substrate having a gaseous layer between excitation light-emitting portions of each of the light sources.

Materials for the laser diode chips are sequentially stacked on a semiconductor substrate to form each laser diode chip comprising the composite light source and the materials are not stacked in a space between the excitation light-emitting portions of each of the laser diode chips.

A distance D2 between the plurality of adjacent laser diode chips is between 10 μm and 1 mm, and a distance D1 between the excitation light-emitting portions is between 60 μm and 1 mm provided D1>D2.

BRIEF DESCRIPTION OF THE DRAWINGS

The above aspects and advantages of the present invention will become more apparent by describing in detail an exemplary embodiment thereof with reference to the attached drawings in which.

DETAILED DESCRIPTION OF THE INVENTION

Figure 1:
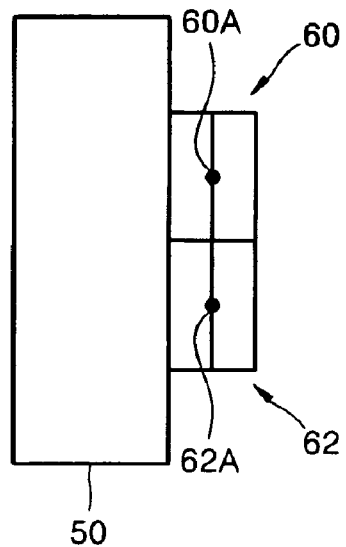
FIG. 1 is a front view of a conventional composite light source.
Figure 2:
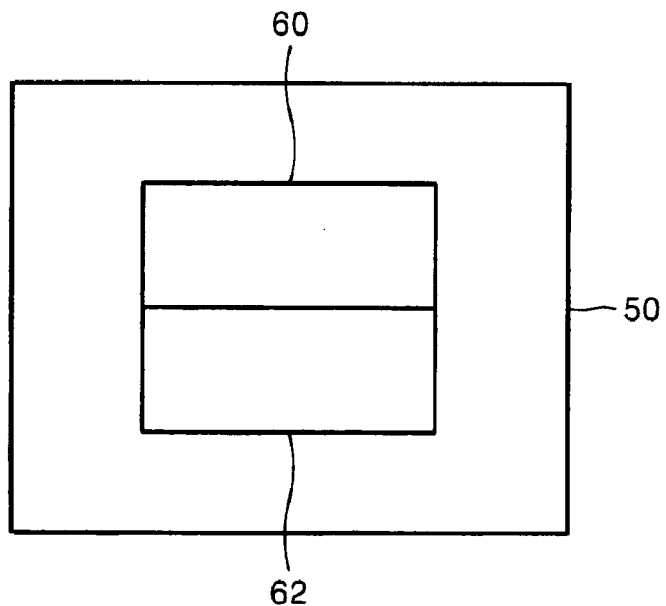
FIG. 2 is a side view of FIG. 1.
Figure 3:
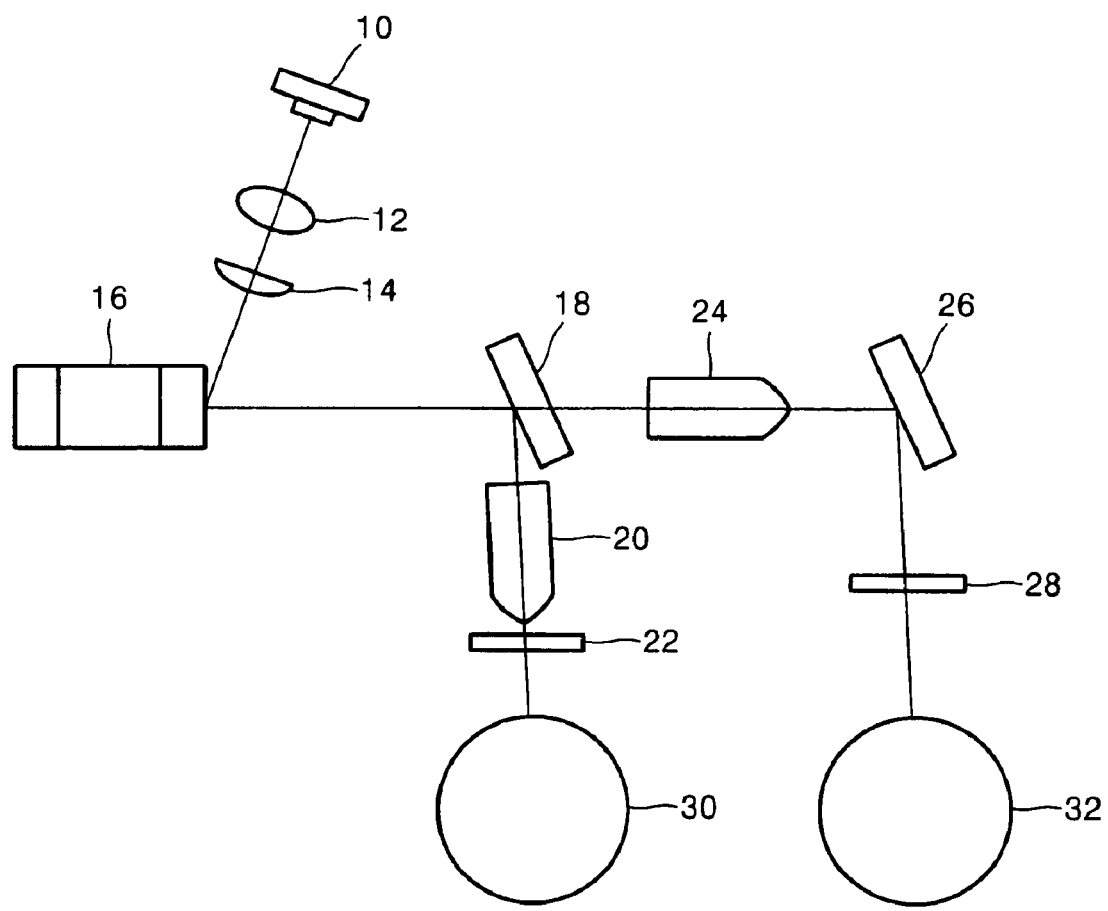
FIG. 3 shows a structure of a light scanning apparatus according to an embodiment of the present invention.

Referring to FIG. 3, a light scanning unit according to an embodiment of the present invention includes a composite light source 10 for emitting a plurality of (in the present embodiment, two) coherent light beams having different wavelengths, a collimator lens 12, a cylinder lens 14, a polygonal rotating mirror 16, a half mirror 18, a first F-θ lens 20, a first band pass filter 22, a second F-θ lens 24, a mirror 26, and a second band pass filter 28.

Figure 4:
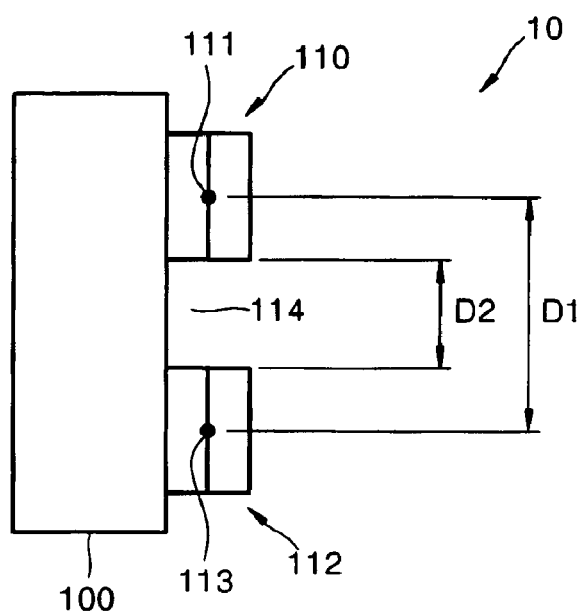
FIG. 4 is a front view of a composite light source in the light scanning apparatus shown in FIG. 3.
Figure 5:
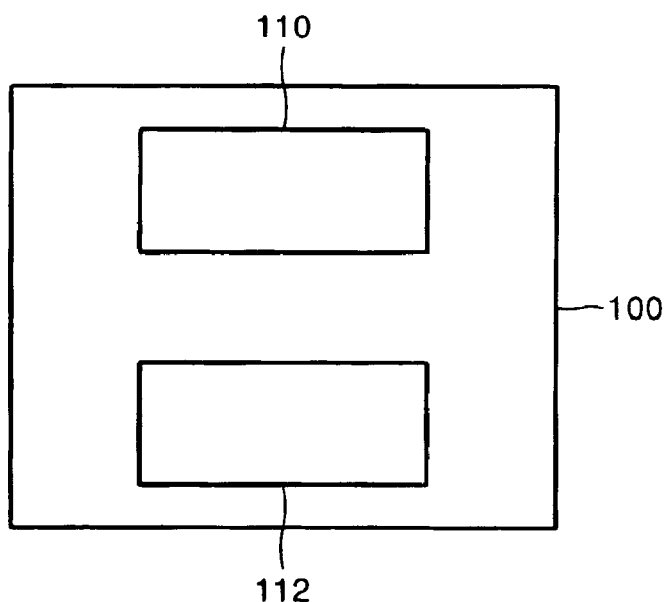
FIG. 5 is a side view of FIG. 4.

The structure of the composite light source 10 is shown in FIGS. 4 and 5. FIG. 4 is a front view of the composite light source 10, and FIG. 5 is a side view of FIG. 4. In the present embodiment, the composite light source 10 is a multi-beam laser diode for emitting two light (coherent light) beams having different wavelengths. Two laser diode chips 110 and 112 (which correspond to a light source of the present invention) for emitting light beams having two different wavelengths (for example, wavelengths of 650 nm and 780 nm) are arranged adjacent to each other on a substrate 100. Reference numerals 111 and 113 respectively denote excitation light-emitting portions for emitting light beams from the laser diode chips 110 and 112. The distance between the excitation light-emitting portions 111 and 113 of each of the two laser diode chips 110 and 112, that is, the distance D1 between optical axes, is preferably between 60 μm and 1 mm inclusive. Distance D2 between the laser diode chips 110 and 112 is preferably between 10 μm and 1 mm inclusive (provided D1>D2). In other words, D1 should be greater than D2 such that the plurality of light beams emitted from the composite light source 10 are commonly used in one optical system.

The excitation light-emitting portions 111 and 113 are arranged adjacent to each other on the substrate 100 where a gaseous layer 114 is placed between the excitation light-emitting portions 111 and 113.

The two laser diode chips 110 and 112 are adhered onto the substrate 100 to form the above-described position relationship.

In addition, in the present embodiment, the two laser diode chips 110 and 112 are adhered onto the substrate 100 and are mounted on the substrate 100. Meanwhile, the present invention is not limited to the above-described embodiment, and modifications in which materials for laser diode chips are sequentially stacked on a semiconductor substrate, thereby forming each laser diode chip as each light source comprising the composite light source 10 and the materials are not stacked in a space between the excitation light-emitting portions of each of the laser diode chips, thereby forming the composite light source 10, are possible.

Referring to FIG. 3, the collimator lens 12 collimates a light beam emitted from the composite light source 10.

In addition, the cylinder lens 14 condenses a light beam onto a reflective surface of the polygonal rotating mirror 16 and performs focusing only in a subscanning direction of exposed objects 30 and 32 with respect to a transmitted light beam and does not have power in a main scanning direction. Here, the subscanning direction thereof is a rotational direction of the exposed objects 30 and 32, and the main scanning direction thereof is an axial direction of the exposed objects 30 and 32.

The polygonal rotating mirror 16 is rotated and driven by a driving unit (not shown) at a predetermined angular velocity and scans an incident light beam in the main scanning direction of exposed surfaces of the exposed objects 30 and 32 according to its rotation.

The first F-θ lens 20 condenses a light beam having a short wavelength of 650 nm onto the exposed surface of the exposed object 30 and radiates the condensed light beam to uniformly scan. In addition, the second F-θ lens 24 condenses a light beam having a long wavelength of 780 nm on the exposed surface of the exposed object 32 and radiates the condensed light beam to uniformly scan. In addition, the first band pass filter 22 only transmits a light beam having a short wavelength of 650 nm, and the second band pass filter 28 only transmits a light beam having a long wavelength of 780 nm.

In addition, the half mirror 18 with the first band pass filter 22 and the half mirror 18 with the second band pass filter 28 correspond to optical elements for splitting a light beam with respect to each different wavelength, according to embodiment of the present invention. In addition, the exposed objects 30 and 32 are photosensitive drums, for example, and are rotated and driven by a driving unit (not shown) in a subscanning direction. In the above structure, two light beams having different wavelengths are intensity-modulated by a modulation unit (not shown) according to information on different images and are emitted from the composite light source 10. The two light beams are emitted at a divergence angle centering on an optical axis.

The light beams emitted from the composite light source 10 are collimated by the collimator lens 12, focused by the cylinder lens 14, and condensed onto the reflective surface of the polygonal rotating mirror 16.

The light beams reflected by the polygonal rotating mirror 16 are split by the half mirror 18 into two parts. A one-way light beam of the split light beams is irradiated on the exposed surface of the exposed object 30 through the first F-θ lens 20 and the first band pass filter 22 and is scanned in the subscanning direction on the exposed surface of the exposed object 30 according to rotation of the polygonal rotating mirror 16. Since only the light beam having a short wavelength of 650 nm is transmitted from the first band pass filter 22, the light beam having a short wavelength of 650 nm is condensed onto the exposed surface of the exposed object 30 by the first F-θ lens 20 and is scanned uniformly in the subscanning direction of the exposed surface.

In addition, another-way light beam of the light beams split into two parts by the half mirror 18 is irradiated on the exposed surface of the exposed object 32 through the second Fθlens 24, the mirror 26, and the second band pass filter 28 and is scanned in the main scanning direction on the exposed surface of the exposed object 32 according to rotation of the polygonal rotating mirror 16. Here, since only a light beam having a long wavelength of 780 nm is transmitted from the second band pass filter 22, the light beam having a short wavelength of 780 nm is condensed onto the exposed surface of the exposed object 30 by the second F-θ lens 24 and is scanned uniformly in the main scanning direction of the exposed surface. Thus, information of different images is recorded by a light beam having a short wavelength on the exposed surface of the exposed object 30, and information of difference images is recorded by a light beam having a long wavelength on the exposed surface of the exposed object 32.

As described above, in the light scanning unit according to the embodiment of the present invention, a composite light source for emitting a plurality of light beams having different wavelengths is used as a light source, and an optical system of the light scanning unit is commonly used for light beams having different wavelengths. Thus, the configuration of the light scanning unit can be simplified, and a low-priced light scanning unit can be implemented.

In addition, a plurality of light sources (laser diode chips) comprising the composite light source are arranged adjacent to each other on a substrate where a gaseous layer is placed between excitation light-emitting portions of each of the light sources, so that cross-talk does not occur even when the plurality of adjacent light sources are simultaneously driven and the deterioration of a printing quality is prevented.

While the invention has been particularly shown and described with reference to preferred embodiments thereof, it will be understood by those of skill in the art that various changes in form and details may be made therein without departing from the spirit and scope of the invention as defined by the appended claims.

What is claimed is:

1. A light scanning unit comprising:

a composite light source in which a plurality of light sources for emitting coherent light having different wavelengths are arranged adjacent to one another and an optical axis of each light source is arranged almost parallel to each other and which emits light at a divergeing angle centering on each optical axis; and an optical system comprising a collimator lens arranged on an approximately central axis of an optical axis of each light source comprising the composite light source and collimates the light beam emitted from the composite light source, a cylinder lens for condensing the light beam emitted from the collimator lens, and a polygonal rotating mirror for scanning the light beam condensed by the cylinder lens in a main scanning direction on an exposed surface of an exposed object, wherein each light source is arranged adjacent to each other on a substrate having a gaseous layer between excitation light-emitting portions of each of the light sources.

2. The light scanning unit of claim 1, wherein a plurality of laser diode chips serving as different light sources are adhered onto the substrate to form the composite light source.

3. The light scanning unit of claim 2, wherein a distance D2 between the plurality of adjacent laser diode chips is between 10 μm and 1 mm, and a distance D1 between the excitation light-emitting portions is between 60 μm and 1 mm provided D1>D2.

4. The light scanning unit of claim 1, wherein materials for the laser diode chips are sequentially stacked on a semiconductor substrate to form each laser diode chip and each light source and the materials are not stacked in a space between the excitation light-emitting portions of each of the laser diode chips.

5. The light scanning unit of claim 4, wherein a distance D2 between the plurality of adjacent laser diode chips is between 10 μm and 1 mm, and a distance D1 between the excitation light-emitting portions is between 60 μm and 1 mm provided D1>D2.

* * * * *